Nov. 4, 1969 D. L. TOLLIVER 3,476,619

SEMICONDUCTOR DEVICE STABILIZATION

Filed Sept. 13, 1966

INVENTOR.
Donald L. Tolliver

BY Mueller, Aichele & Rauner

ATTYS.

3,476,619
SEMICONDUCTOR DEVICE STABILIZATION
Donald L. Tolliver, Phoenix, Ariz., assignor to Motorola, Inc., Franklin Park, Ill., a corporation of Illinois
Filed Sept. 13, 1966, Ser. No. 579,153
Int. Cl. H01l 7/44
U.S. Cl. 148—187 7 Claims

ABSTRACT OF THE DISCLOSURE

A semiconductor device having one or more shallow PN junctions covered with an adherent layer of silicon dioxide, is stabilized by a process involving the steps of depositing an additional layer of silicon dioxide containing a preselected impurity, preferably phosphorus, on the adherent initial layer of silicon dioxide. The composite structure is then heated for the purpose of increasing the density of the silicon dioxide and to redistribute a portion of the impurity into the initial adherent layer of silicon dioxide.

Figure 2:
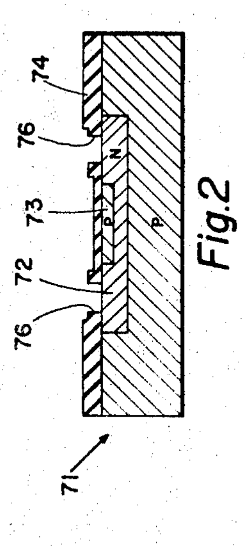

This invention relates to semiconductor devices and their fabrication. More particularly, this invention relates to a process for fabricating a semiconductor device, such as a shallow junction PNP transistor or an MOS field-effect transistor and the structure for such a device.

For a semiconductor device to be practical, its operating characteristics must be stable. Such devices have been stabilized by applying a passivating layer, such as silicon dioxide, on a surface of a body of semiconductor material at which the PN junctions terminate. Such a passivating layer substantially improves the performance of the semiconductor device, particularly a silicon device. The stability of the operating characteristics of a device is also known to be further improved by diffusing beneficial impurities into the semiconductor material and its passivating layer. A common example of this stabilization is a phosphorus diffusion performed as one of the final high temperature operations in the device fabrication.

For a phosphorus diffusion to effectively stabilize a semiconductor device, it has been necesary to diffuse a relatively high concentration of phosphorus into the exposed surface of the passivating layer. Generally, to insure a stabilized device, the amount of phosphorus used has been much greater than the amount actually required. To form this phosphorus rich layer, the diffusion was performed at a temperature between about 1150° and 1250° C.

For a semiconductor device having a junction depth of between about 2.0 and 3.0 microns or more this high temperature operation has substantially no adverse effects upon the final device characteristics. However, with shallow junction devices having PN junctions between about 0.4 and 0.6 micron or less in depth, this high temperature operation presents a substantial problem. In diffusing the shallow junctions, compensation in excess of 100% has been necessary to allow for variations in junction depth resulting from such high temperature.

With this additional compensation, the possibility of obtaining a suitably functioning device is substantially reduced.

Accordingly, an object of this invention is to provide a process for fabricating a stable device, primarily a shallow junction semiconductor device, in which the stabilization step of introducing an impurity into a body of semiconductor material and passivating layer thereon is performed at a low temperature.

Another object of this invention is to provide a process for fabricating a semiconductor device with improved control over the amount of impurity introduced into the body of semiconductor material and the passivating layer thereon.

A further object of this invention is to provide an improved, stable semiconductor device, particularly one with a shallow junction, that meets preselected electrical requirements.

A feature of this invention is a process for fabricating a stable semiconductor device, such as a shallow junction semiconductor device, in which a layer of silicon dioxide including a preselected impurity is deposited on a body of semiconductor material and a passivating layer thereon at a low temperature.

Another feature of the invention is a stable semiconductor device including a layer comprising primarily silicon dioxide with a controlled amount of an impurity extending a slight distance into the silicon dioxide.

A further feature of this invention is a stable semiconductor device having a shallow junction and a passivating layer comprising primarily silicon dioxide, including a controlled amount of an impurity extending into the passivating layer a slight distance from the exposed face thereof.

Figure 1:
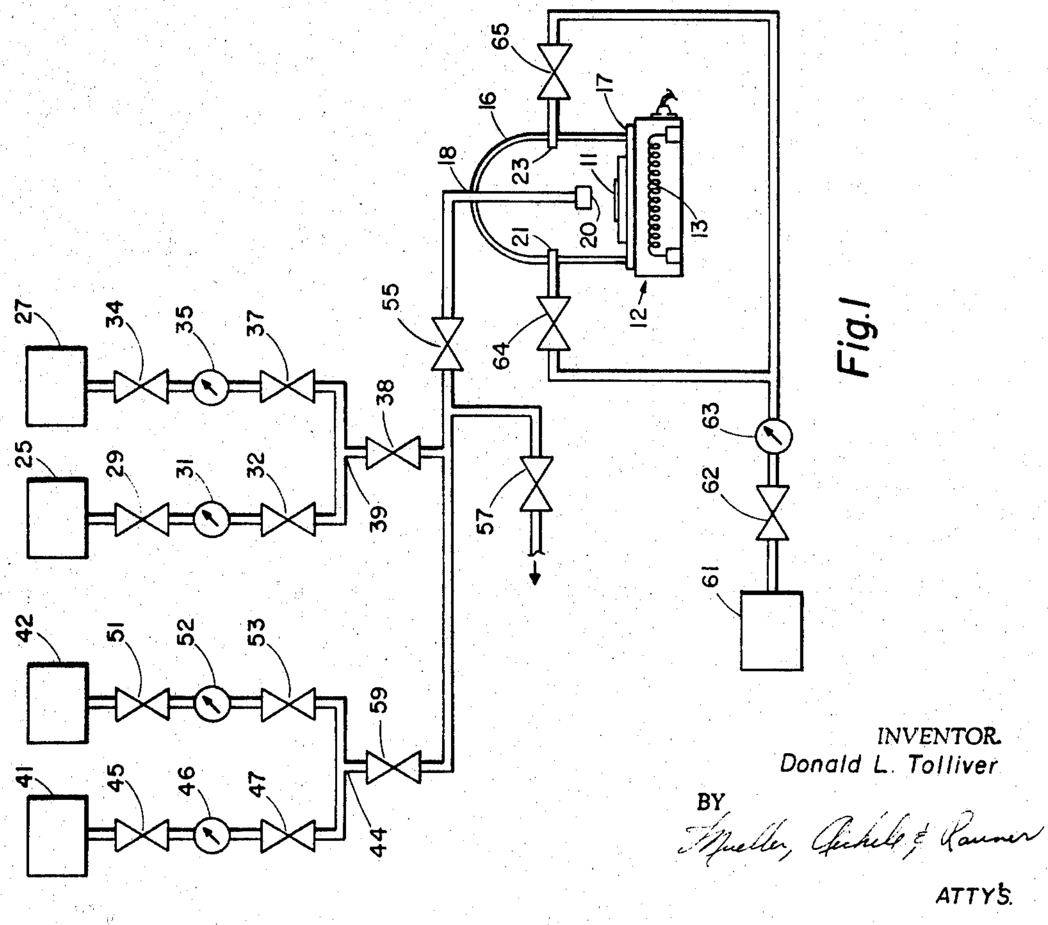

In the accompanying drawings:

FIG. 1 is a schematic diagram showing a system for depositing a layer of silicon dioxide including a preselected impurity on a body of semiconductor material; and FIGS. 2 to 5 are cross-sectional views of a semiconductor die representing progressive stages in the process of the invention.

The invention is embodied in a process for treating a body of semiconductor material to stabilize a semiconductor device fabricated with the body so treated. The process comprises immersing a body of semiconductor material having a substantially flat major face covered with an adherent layer of silicon dioxide including an opening exposing a portion of the body in boiling deionized water. A layer comprised primarily of silicon dioxide and a lesser amount of a preselected impurity is deposited at a low temperature, on the adherent layer of silicon dioxide. The body is then heated and the impurity redistributed in the deposited silicon dioxide and the adherent layer of silicon dioxide.

The invention is also embodied in a device including a body of semiconductor material having a flat face with regions of different conductivity type forming a PN junction terminating at the face. A layer comprised primarily of silicon dioxide is disposed over substantially the entire face. This layer includes a portion about 1000 angstroms thick extending therein from an exposed face of the layer opposite the flat face with a low concentration of a preselected impurity. Electrical leads are attached completing the device.

The semiconductor material which is treated in accordance with the present invention is advantageously a single crystal element such as silicon or germanium, although various semiconductor compounds may also be employed. The crystal element is advantageously a wafer which is typically obtained from a larger crystal grown by known crystal pulling or melting processes. The larger crystal is sliced into wafers and the wafers lapped, polished and otherwise processed to make their major faces substantially parallel to each other. The cross-sectional dimension of the wafers may be of any value and the thickness of the wafers can be within a practical range, e.g., about 4 to 40 mils.

Generally, at least one of the major faces of the wafer has a protective layer thereon that is utilized as a masking material for the formation of regions of different conductivity type. Silicon dioxide is advantageously utilized for this masking material because it may be readily patterned using known etching processes and effectively retards the diffusion of most impurities utilized in doping semiconductors. Also, silicon dioxide is conveniently formed on the face of the wafer with thermal or epitaxial processes. The thickness of the layer of silicon dioxide will vary according to the device processing requirements and the number of steps involved in obtaining a final structure. This oxide is usually retained on the face of the wafer at the conclusion of the processing to passivate and protect the face of the wafer.

The regions of different conductvity type within the wafer are preferably formed with known epitaxial or diffusion processes. In forming these regions, the mask is patterned to define areas substantially identical to the final regions of the device being fabricated. The dimensions, doping level, position and other properties of these regions are tailored to form PN junctions according to the device requirements.

The layer of low temperature silicon dioxide is advantageously deposited on the wafer by passing a gaseous mixture including a compound of silicon, a source of impurity, and an unreactive diluent gas over the wafer while it is maintained at a raised temperature. The layer of silicon dioxide deposited will include the impurity, preferably in the form of another dioxide, originally mixed with the compound of silicon. This combined silicon dioxide and impurity will be referred to as silicon dioxide. The compound of silicon is preferably selected from the many which are well known, such as silane, silicon tetrachloride, etc., that are readily oxidized to form silicon dioxide and volatile reaction products easily removed from the reaction area. The compound of silicon usually is mixed with an unreactive diluent gas, such as argon, nitrogen, helium, etc., before being combined with the oxygen.

The silicon dioxide may be deposited by passing the gaseous mixture over the wafer while it is maintained at a temperature between about 375° and 900° C. Preferably, the wafer is maintained at a temperature between about 400° and 450° C. The temperature of the wafer is determined by the rate at which the silicon dioxide is to be deposited and its compatibility with existing device components. Since the gaseous mixture is not heated, the reaction occurs primarily at the exposed face of the wafer.

This reaction is beneficially carried out so that the unreacted gases and volatile reaction products are swept away from the wafer and surrounding equipment. The rapid removal of the unreacted gases and reaction products results in a very celan system that is easily maintained in a substantially contamination-free state.

The impurity to be included in the deposited glass is preferably transported to the wafer after being mixed with the compound of silicon and diluent gas stream. The impurity source will generally be in a well known oxidizable form, such as a hydride or organic compound. Impurity compounds, such as arsine, phosphine, stibine, tri-ethyl phosphorus, tri-ethyl aluminum, tri-butyl stibine, etc., are advantageously utilized. The amount of impurity in the deposited silicon dioxide may be closely regulated over a broad range by controlling the amount of source impurity compound introduced into the gaseous mixture.

The physical and chemical properties of the silicon dioxide on the wafer are also beneficially regulated by adjusting the amount of impurity therein. Particularly, the coefficient of thermal expansion may be adjusted to match that of the wafer and the previously formed protective layer. Also, the facility to etch silicon dioxide is generally dependent upon the concentration of impurity.

The wafer with the impurity rich silicon dioxide is heated or annealed to, in effect, redistribute the impurity into the underlying protective layer and semiconductor material. In this annealing step, a concentration gradient of the impurity is created in what is now a layer that substantially improves the stability of the final device. Also, highly doped regions are created in the regions where the deposited silicon dioxide contacts the surface of the wafer. A temperature between about 600° and 1100° C. may be utilized for this annealing, and preferably a temperature between about 750° and 850° C. is used. The annealing also improves the density of the silicon dioxide by driving off volatile species, such as water, that are included therein during its deposition. A phosphorus concentration in the outer exposed portion of the annealed oxide between about 0.1 and 20% by weight is advantageously used for stabilization.

A system for depositing a layer of silicon dioxide utilized in the invention is shown in FIG. 1. This is illustrative of one system that is suitable for depositing this glass, although it is not intended to restrict the scope of the invention. A suitably prepared wafer 11 of semiconductor material is positioned on a hot plate 12. Hot plate 12 is heated with an electrical resistance coil 13 positioned underneath wafer 11. The temperature of wafer 11 may be accurately regulated by adjusting a voltage control for resistance heater 13. A bell jar 16 is placed over wafer 11 and in contact with a surface 17 of hot plate 12 to provide an enclosed chamber about wafer 11 that is vented at the bottom of bell jar 16. A tube 18 for introducing the silicon compound, impurity and diluent gas terminates within bell jar 16, where it is connected to a diffuser 20 immediately above wafer 11. Two other openings 21, 23 are provided in bell jar 16 for introducing the oxygen.

A gaseous mixture is formed by combining a gas stream from a source 25 of a silicon compound with an unreactive diluent, such as argon, from a source 27. Source 25 may comprise a gaseous silicon compound, such as silane, or a liquid such as silicon tetrachloride, the vapors of which are transported by the diluent gas. The flow rate of the silicon compound is regulated by a valve 29 and a meter 31. A second valve 32 is utilized to permit the termination and re-establishment of the same flow of the compound without further adjustment of valve 29. The silicon compound is mixed with a diluent gas from source 27 that is regulated by a valve 34 and a meter 35. The diluent is also provided with a shut-off valve 37, which permits the facile termination and re-establishment of this stream. The combined streams are regulated by a valve 38 located after a mixing point 39.

An impurity from a source 41 is combined with a diluent from a source 42 at a mixing point 44. Source 41 may comprise a gaseous compound under pressure, such as phosphine, or a solid or liquid compound, such as tri-ethyl phosphorus, the vapors of which are transported by the diluent. This combined stream is mixed with the combined silicon compound stream and introduced into bell jar 16 through tube 18. The flow of the impurity stream is regulated by a valve 45, meter 46 and a valve 47. Similarly, the flow of the diluent gas is controlled by valve 51, a meter 52 and a valve 53.

The combined impurity stream is regulated by a valve 59 located after mixing point 44. The flow of the mixed streams or individual streams into bell jar 16 is regulated by a valve 55 and a bleed-off valve 57.

Oxygen from a source 61 is introduced into the bell jar at openings 21, 23. The flow of oxygen is controlled by a valve 62 and meter 63. The introduction of the oxygen into bell jar 16 is regulated by valve 64 and 65.

The gas streams mix in bell jar 16, flow over wafer 11 and exhaust through openings at surface 17. The mixed gas streams also carry away the reaction products and unreacted material.

The steps of stabilizing a body of semiconductor material according to the invention is illustrated in FIGS. 2 through 5 for a transistor device. A die 71 (FIG. 2) of semiconductor material was treated to form a base region 72 and an emitter region 73. Die 71 was one of a plurality of dies fabricated substantially simultaneously while still a portion of a larger wafer of semiconductor material. One face of die 71 was covered with a protective layer 74 comprised of silicon dioxide and various additional impurities incorporated into the oxide during diffusion. An opening 76 was formed in layer 74 exposing a portion of the face of base region 72.

Figure 3:
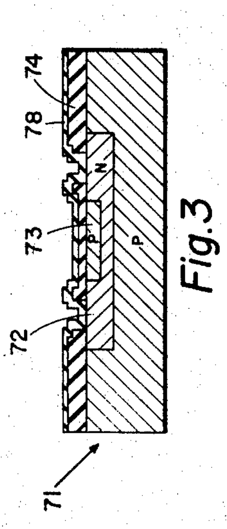

In FIG. 3, die 71 is shown after a thin layer of silicon dioxide 78 including a preselected impurity has been deposited on substantially the entire surface of protective layer 74 and exposed portions of base region 72. Silicon dioxide 78 conformed to the contour of the die surface and contacted substantially the entire exposed portion of region 72.

Figure 4:
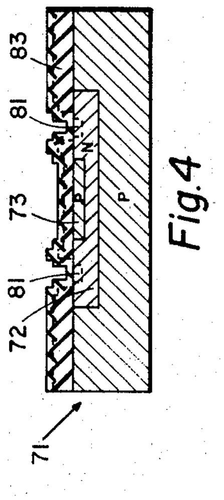

Die 71 is shown in FIG. 4 after it has been annealed. The impurity originally located in silicon dioxide 78 (FIG. 3) has diffused into passivation 74. The concentration of the impurity was selected so that the effective depth; i.e., effective concentration, of this diffusion was limited. During the annealing, the portion of base region 72 that was in contact with silicon dioxide 78 was doped with the impurity, creating a highly doped "plus" region 81 suitable for making ohmic contact. The identity of protective layer 74 and silicon dioxide 78 were sufficiently altered by the annealing that a passivating layer 83 resulted.

Figure 5:
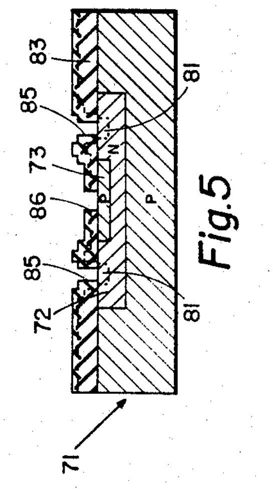

A die is shown in FIG. 5 with openings 85, 86 in passivation 83 exposing portions of plus region 81 and emitter region 73. Openings 85, 86 were formed utilizing well known photoresist techniques. The etching of passivation 83 was facilitated by the prior annealing of layer 78. The wafer thusly prepared was further processed in accordance with well known techniques to complete the transistor device.

The following examples illustrate specific embodiments of the invention, although it is not intended that the examples restrict the scope of the invention.

Example I

Silicon wafers having a plurality of regions formed therein for PNP transistors, with a protective layer comprising silicon dioxide on a face thereof, were treated to form openings in the protective layer according to well known photoresist techniques exposing areas of the N type conductivity region. The wafers were immersed in boiling deionized water for ten to fifteen minutes. After the deionized water treatment, the wafers were rapidly placed on a hot plate in the silicon dioxide deposition apparatus previously described. A gaseous mixture comprised of primarily diluent gas, and lesser amounts of phosphine, silane and oxygen was passed over the wafers at a temperature between about 425° and 450° C. The approximate quantities in this gaseous mixture were about 89% diluent, 0.1% to 1% phosphine, 0.1% to 1% silane and 10% oxygen. The wafers were maintained at this temperature for about one to two minutes with the gas flow sustained.

The wafers, with the deposited silicon dioxide thereon, were placed in an annealing furnace at a temperature of about 850° C. for about 30 minutes. An etchant was applied to the wafers to form the pre-ohmic contact patterns, and the wafers were further processed according to well known techniques to complete the devices.

Some of the wafers processed were inspected after the deposition of the silicon dioxide and a layer 3000 angstroms thick had been deposited on the protective layer. The deposited silicon dioxide had a concentration of about 5% phosphorus. Other wafers were inspected after the completion of the annealing. There was no discernible delineation between the deposited silicon dioxide and the protective layer on the face of the wafer. From the observed etching rates, it was believed the phosphorus concentration was between about 3 and 5% by weight in the 1000 angstroms of the combined silicon dioxide farthest from the face of the silicon wafers. A higher percentage of the devices fabricated in this way met the preselected electrical characteristics. Additionally, there was no measureable change in the dimensions of the diffused regions previously formed.

Example II

The procedure of this example was the same as that of Example I except for the following: An impurity source of liquid tri-ethyl phosphorus was used. The liquid was heated to about 100° C. and a stream of diluent gas passed through to form a vapor mixture.

The same beneficial results were obtained with wafers processed with this procedure.

Example III

The procedure of this example was the same as that of Example I except for the following: The wafers processed were previousy treated to form the basic structure of an MOS field-effect transistor. The silicon dioxide with the impurity was deposited as described in Example I. The wafers were further processed according to known techniques to complete the devices.

The resulting devices were more stable electrically and had yields similar to Example I.

The above description, examples and drawings show that the present invention provides a novel process for treating a body of semiconductor material and a novel structure for semiconductor devices. Furthermore, by this process the stabilization of semiconductor devices may be performed at low temperatures. Moreover, the amount of impurity introduced into the passivating layer or layer of silicon dioxide on a semiconductor body may be more closely controlled. Additionally, a semiconductor device, particularly one with a shallow junction, is provided that is more stable and of which a higher percentage meet preselected electrical characteristics.

I claim:

1. A process for the stabilization of a semiconductor device having at least one PN junction located at a depth no greater than 0.6 micron within the semiconductor body, said device including an adherent layer of silicon dioxide covering said junction, comprising the steps of depositing on said adherent layer of silicon dioxide, which is at a temperature between about 350° C. and about 900° C., an additional layer of silicon dioxide containing a preselected impurity, and then heating the composite structure to a temperature no greater than 850° C., for a time sufficient to anneal said silicon dioxide, but insufficient to cause any significant change in the dopant profile of the semiconductor body of said device.

2. The process according to claim 1 in which said body is silicon.

3. The process according to claim 1 including the additional step of affixing electrical coupling means to portions of said body.

4. The process according to claim 1 in which said layer of deposited silicon dioxide is formed by passing a gaseous mixture including a compound of silicon, a source of impurity, oxygen and an unreactive diluent gas over said body at a temperature between about 375° and 900° C.

5. The process according to claim 4 in which said compound of silicon comprises silicon tetrachloride.

6. The process according to claim 4 in which said body is at a temperature between about 375° and 550° C.

7. The process according to claim 4 in which said compound of silicon comprises silane.

References Cited

UNITED STATES PATENTS

| | | | |
|---|---|---|---|
| 2,899,344 | 8/1959 | Atalla et al. | 148—187 X |
| 2,948,642 | 8/1960 | MacDonald | 14—187 X |
| 3,200,019 | 8/1965 | Scott et al. | 148—188 |
| 3,264,707 | 8/1966 | Elie | 148—187 X |
| 3,309,245 | 3/1967 | Haenichen | 148—187 |
| 3,341,381 | 9/1967 | Bergman et al. | 148—187 |

L. DEWAYNE RUTLEDGE, Primary Examiner

R. A. LESTER, Assistant Examiner

U.S. Cl. X.R.

29—571, 576, 588; 117—215; 148—186, 188, 189, 190